United States Patent
Brun et al.

(10) Patent No.: US 8,654,540 B2
(45) Date of Patent: Feb. 18, 2014

(54) METHOD FOR ASSEMBLING AT LEAST ONE CHIP WITH A WIRE ELEMENT, ELECTRONIC CHIP WITH A DEFORMABLE LINK ELEMENT, FABRICATION METHOD OF A PLURALITY OF CHIPS, AND ASSEMBLY OF AT LEAST ONE CHIP WITH A WIRE ELEMENT

(75) Inventors: Jean Brun, Champagnier (FR);
Dominique Vicard, Saint-Nazaire-les-Eymes (FR)

(73) Assignee: Commisariat a l'Energie Atomique et aux Energies Alternatives, Paris (FR)

( * ) Notice: Subject to any disclaimer, the term of this patent is extended or adjusted under 35 U.S.C. 154(b) by 386 days.

(21) Appl. No.: 12/977,460

(22) Filed: Dec. 23, 2010

(65) Prior Publication Data
US 2011/0149540 A1 Jun. 23, 2011

(30) Foreign Application Priority Data
Dec. 23, 2009 (FR) ...................................... 09 06333

(51) Int. Cl.
*H05K 7/00* (2006.01)
*H05K 1/00* (2006.01)
*H05K 1/03* (2006.01)
*H05K 7/12* (2006.01)
*H01L 21/00* (2006.01)

(52) U.S. Cl.
USPC ........... 361/779; 174/250; 174/255; 361/767; 361/771; 361/777; 438/108

(58) Field of Classification Search
USPC .......... 257/466, 622, 727, 734; 361/783–785, 361/790, 792, 767, 771, 777, 779; 174/250, 174/255; 438/108
See application file for complete search history.

(56) References Cited

U.S. PATENT DOCUMENTS

| | | | |
|---|---|---|---|
| 6,648,213 B1 * | 11/2003 | Patterson et al. | 228/223 |
| 7,370,786 B2 * | 5/2008 | Kurita et al. | 228/110.1 |
| 2002/0151228 A1 * | 10/2002 | Kweon et al. | 439/887 |
| 2003/0025187 A1 * | 2/2003 | Strutz et al. | 257/684 |
| 2004/0049909 A1 * | 3/2004 | Salot et al. | 29/623.5 |

(Continued)

FOREIGN PATENT DOCUMENTS

| | | |
|---|---|---|
| EP | 2 099 060 A1 | 9/2009 |
| FR | 2 937 464 A1 | 4/2010 |
| WO | WO 2008/025889 A1 | 3/2008 |
| WO | WO 2009/112644 A1 | 9/2009 |

OTHER PUBLICATIONS

Brun, J. et al., "Localized Micro-Insert Connections for Smart Card Secure Micro Packaging," *4th European Microelectronics and Packaging Symposium*, May 22-24, 2006, pp. 1-6, Terme Catez, Slovenia.

(Continued)

*Primary Examiner* — Jeremy Norris
*Assistant Examiner* — Sherman Ng
(74) *Attorney, Agent, or Firm* — Oliff PLC

(57) ABSTRACT

A first step of the method for assembling a wire element with an electronic chip comprises arranging the wire element in a groove of the chip delineated by a first element and a second element, joined by a link element comprising a plastically deformable material, and a second step then comprises clamping the first and second elements to deform the link element until the wire element is secured in the groove.

9 Claims, 7 Drawing Sheets

(56) References Cited

U.S. PATENT DOCUMENTS

2004/0212098 A1* 10/2004 Pendse .......................... 257/778
2005/0218195 A1* 10/2005 Wilson et al. ............ 228/180.22
2005/0223552 A1* 10/2005 Meyer et al. .................... 29/832
2006/0177965 A1* 8/2006 Senda .......................... 438/108
2006/0261446 A1 11/2006 Wood et al.
2009/0200066 A1* 8/2009 Vicard et al. .................. 174/255

OTHER PUBLICATIONS

Brun, J. et al., "Packaging and Wired Interconnections for Insertion of Miniaturized Chips in Smart Fabrics," pp. 1-5.

* cited by examiner

_US 8,654,540 B2_

METHOD FOR ASSEMBLING AT LEAST ONE CHIP WITH A WIRE ELEMENT, ELECTRONIC CHIP WITH A DEFORMABLE LINK ELEMENT, FABRICATION METHOD OF A PLURALITY OF CHIPS, AND ASSEMBLY OF AT LEAST ONE CHIP WITH A WIRE ELEMENT

BACKGROUND OF THE INVENTION

The invention relates to a method for assembling a wire element with an electronic chip.

STATE OF THE ART

Numerous techniques exist nowadays for mechanically and electrically connecting microelectronic chips to one another. The conventional technique consists in making a rigid mechanical connection between the chips, once the chips have been formed on a substrate and released by cutting. The chips, then fixed on a rigid support, are then electrically connected before a protective coating is formed. This approach, consisting in making the connection on a rigid support, is conventionally used when a great complexity in connection of the chips exists. However, this approach has the main drawback of using a rigid mechanical support which is particularly unsuitable for integration in flexible structures.

The document WO2008/025889 filed by the applicant describes a micro-electronic chip comprising two parallel main surfaces 1, 2 and opposite side faces 3a, 3b, as illustrated by FIG. 1. At least one of side faces 3a, 3b comprises a groove 4 provided with an electrical connection element (not shown) forming a housing for a wire element 5 having an axis parallel to the longitudinal axis of groove 4. The electrical connection element is achieved by metallization of at least a part of groove 4. Wire element 5, the axis whereof is parallel to the longitudinal axis of groove 4, can be secured to groove 4 by welding with addition of material, by electrolysis, by bonding, or by embedding. Embedding in groove 4 requires wire element 5 and groove 4 to be correctly dimensioned. The strength by embedding may be insufficient and in general requires a strengthening phase by adding adhesive or metal.

The document EP2099060 describes a method for fabricating an assembly of chips to one another. A chip comprises a groove housing a wire element. The wire element is embedded in the groove.

SUMMARY OF THE INVENTION

The object of the invention is to provide an electronic chip that does not present the shortcomings of the prior art and that enables assembly of the chip with wire elements of different types and different sizes.

This objective is tended to by the appended claims, and more particularly by the fact that the method comprises the following steps:
  arranging the wire element in a groove of the chip delineated by a first element and a second element connected by a link element comprising a plastically deformable material, and,
  clamping the first and second elements to deform the link element until fixing of the wire element is achieved in the groove.

The invention also relates to an electronic chip comprising:
  a first element and a second element,
  a link element separating the first and second elements,
  a groove, open at both ends, delineated by the first and second elements and the link element,
  an electric contact pad arranged in the groove,
the link element comprising a material that is plastically deformable by clamping at the level of the first and second elements and that is able to flow up to the pad, before the first and second elements are brought into contact, when clamping is performed.

The invention also relates to a method for fabricating a plurality of chips comprising the following steps:
  procuring an active plate comprising a plurality of active areas each including at least one electronic component and an electric contact pad connected to the associated active area,
  forming an assembly formed by a counterplate placed on the active plate with interposition of a deformable material to form a cavity, at the level of each active area, along one of the edges of said active area and,
  cutting said assembly along the edges of the active areas to form the chips, the cutting path passing through said cavities to obtain, after cutting, a plurality of chips each comprising at least a first and second element separated by a link element formed by the deformable material, and a groove, at the level of one of said chip surfaces, delineated by the first and second elements and the link element, said electric contact pad being arranged in said groove and said deformable material of the link element being able to flow up to the pad before the first and second elements are brought into contact when clamping of the chip is performed.

The invention also relates to an assembly comprising:
  a microelectronic chip comprising a first element and a second element,
  an electrically conductive wire element sandwiched between the first element and the second element,
  a link element in contact with the first and second element and the wire element, the link element participating in fixing the wire element to at least one of the first and second elements.

BRIEF DESCRIPTION OF THE DRAWINGS

Other advantages and features will become more clearly apparent from the following description of particular embodiments of the invention given for non-restrictive example purposes only and represented in the appended drawings, in which:

FIGS. 14 to 18 illustrate a second method for fabricating a plurality of chips.

DESCRIPTION OF PARTICULAR EMBODIMENTS

Figure 1:
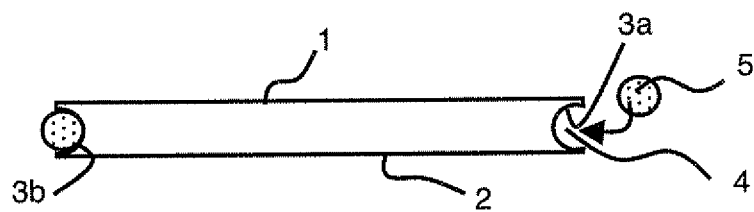
FIG. 1 illustrates a chip with an embedding groove for a wire element according to the prior art.

Unlike electronic chips according to the prior art, the chips described in the following comprise a link element made from plastically deformable material enabling the width of the groove to be varied.

A wire element can thus be arranged in a groove of the chip, the axis of the wire element preferably being parallel to the axis of the groove. The chip is delineated by a first element and a second element connected by the link element comprising the plastically deformable material. The groove can also be delineated by the first element and the second element connected by the link element. Clamping of the first and second elements then deforms the link element until the wire element is secured in the groove.

An electronic chip, illustrated in FIGS. 2 to 11 and able to be used with the method described above, comprises a first element 8 and a second element 8' separated by a link element 6. The chip further comprises a groove 4a open at both ends and delineated by first and second elements 8, 8' and link element 6. Groove 4a can thus comprise two side walls, for example formed by free surfaces facing first and second elements 8, 8', said side walls 9a, 9b being able to be joined to one another by a bottom 9c formed by a portion of link element 6. The chip can comprise an electric contact pad 7 in the case where said chip requires for example an electrical connection with a wire element. Such a pad 7 can be arranged in groove 4a, preferably on one of side walls 9a of groove 4a. Link element 6 may comprise a material that is plastically deformable by clamping at the level of first and second elements 8, 8' and that is able to flow when clamping is performed up to pad 7 before first and second elements 8, 8' are brought into contact. The material of link element 6 can in fact reach the pad when clamping takes place. In the case where the groove does not comprise a pad, clamping combined with the deformable link element 6, that is able to flow, can be sufficient to mechanically secure a wire element, although the use of a pad that either pinches or penetrates into the wire element is preferable.

The chip formed in this way thus comprises two main surfaces 1, 2 joined to one another by side faces 3a, 3b and groove 4a is preferably made in one of the side faces.

Link element 6 forms the equivalent of a spacer or of a part of a spacer separating the two elements 8, 8'.

In the illustrated embodiments, the general shape of the chip is parallelepipedic, the two external main surfaces 1 and 2 then being able to be of substantially equal dimensions, and they are joined by four side faces. Other chip shapes are naturally possible. It is possible for example to have a first element 8 presenting a convex external main surface 1. A side face can further be the extension of a main surface, without precise delineation edges between the latter.

Figure 2:
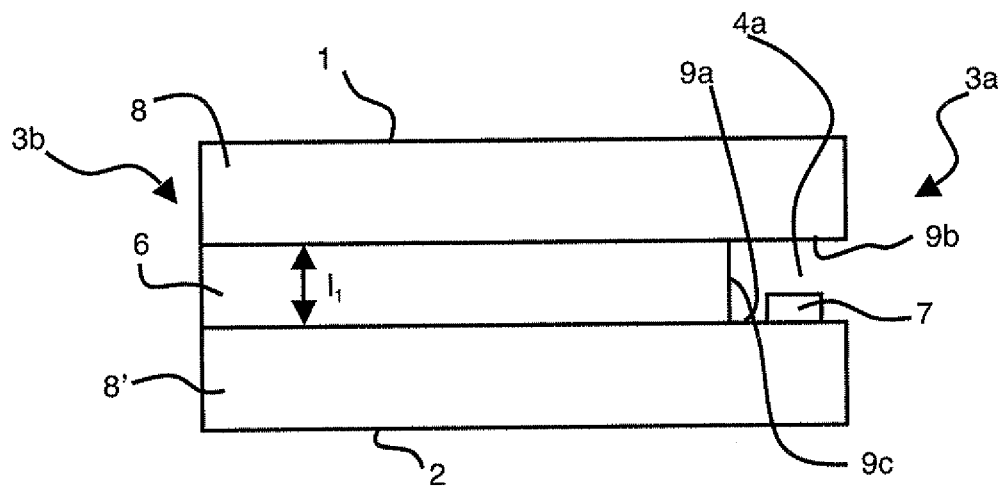
FIG. 2 illustrates a chip according to an embodiment of the invention.
Figure 3:
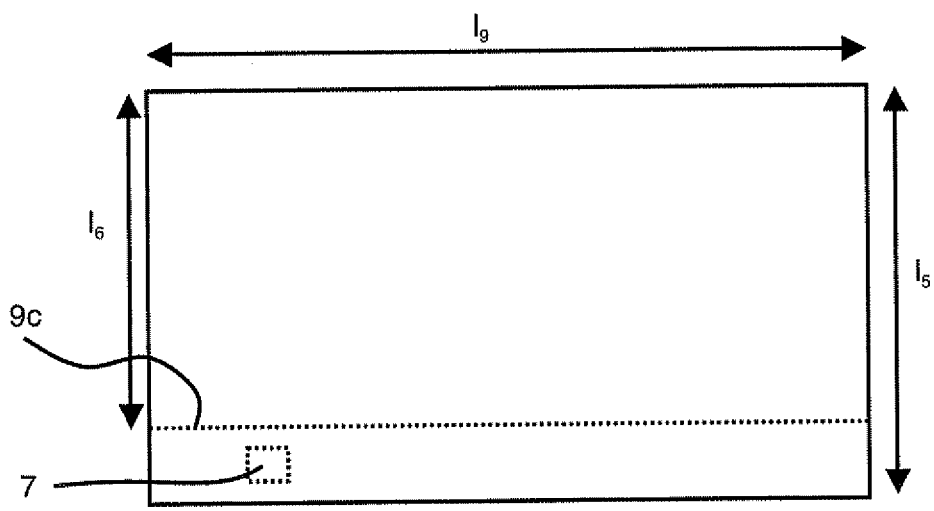
FIG. 3 illustrates a top view of the chip of FIG. 2.

In a first embodiment illustrated in FIGS. 2 and 3, the chip comprises a first element 8 and second element 8' separated by a link element 6 and delineating a longitudinal groove 4a housing a wire element 5 therewith. As described in the foregoing, groove 4a then comprises two side walls 9a, 9b respectively formed by free surfaces facing first and second elements 8 and 8'. Electrical connection pad 7 is placed on one of side walls of groove 4a (side wall 9a in FIG. 2) so that a free area is delineated between the apex of pad 7 and opposite side wall (9b in FIG. 2). The free area is designed to receive a wire element, for example inserted in such a way that the core therefore is parallel to the groove.

According to the first embodiment, first element 8 and second element 8' are preferably of the same dimensions and are arranged facing one another while being separated by link element 6. What is meant by the same dimensions is that the width $I_5$ and length $I_9$ of first and second elements 8, 8' are substantially identical as illustrated in FIG. 3 representing a top view of FIG. 2. According to the particular example of FIGS. 2 and 3, groove 4a then comprises a bottom 9c delineated by link element 6, bottom 9c joining the two facing side walls 9a, 9b. The distance separating the two side walls 9a, 9b of the groove is then equal to height $I_1$ of link element 6.

In order to delineate groove 4a, link element 6 is preferably placed laid back with respect to the edges of first and second elements 8, 8' (FIGS. 2 and 3). In FIG. 3, width $I_6$ of the link element 6 is smaller than width $I_5$ of the chip.

In this particular embodiment, and preferably to others embodiments described in the following, link element 6 is formed by a single layer of a deformable material, the top and bottom surfaces of this layer preferably being parallel to the main surfaces of the chip and respectively in contact with first and second elements 8, 8'.

According to one feature of the invention, link element 6 between first and second elements 8, 8' comprises a material that is deformable by clamping the chip by pressing at the level of its external main surfaces 1 and 2, for example when clamping of the chip is performed in opposite directions perpendicular to external main surfaces 1 and 2. When clamping is performed, the material deformable deforms and flows on the sides, in particular towards and into groove 4a, preferably up to wire element 5. Clamping can be made perpendicularly to the plane of the link element 6.

The quantity of deformable material forming link element 6 is preferably sufficient to enable wire element 5, inserted in the groove prior to clamping, to be secured to at least one of first and second elements 8, 8' of the chip by said material. In other words, the nature of the deformable material must allow deformation of the latter up to the level of wire element 5 when it is subjected to a reasonable pressure, i.e. a pressure not liable to damage the rest of the chip. Furthermore, the nature of the deformable layer is preferably such that, after the pressure has been released, the deformable layer remains in contact with link element 6 and participates in securing wire element 5.

Thus, after the clamping step, securing of wire element 5 in the groove can for example be performed by mechanical pinching of said wire element 5 between first and second elements 8, 8', between a pad 7 and an element 8, 8', and/or by link element 6 deformed until it is brought into contact with wire element 5.

Furthermore, after clamping, it is preferable for the deformable material to continue to perform its role of link element of first and second elements 8, 8', i.e. to continue to ensure securing of these two elements to one another. A part or a residual layer of material could for example be kept sandwiched between elements 8, 8'. In other words, the clamping step can be followed by a step of releasing clamping after which link element 6 remains in the deformed position.

According to an alternative embodiment, it is also possible to provide means for latching the assembly (not shown). Such means can be formed for example by male and female engagement means respectively situated on first and second elements 8, 8'. These engagement means would for example avoid having to maintain clamping to secure the assembly after the clamping step.

The deformable material layer presents a plurality of undeniable advantages for fabrication of the chips, assembly of the latter with a wire element and long-term mechanical strength of the latter once assembled.

Indeed, up to now, the wire elements were simply embedded in the grooves, and a correctly calibrated wire element therefore had to be used for a given chip. The deformable link element therefore enables wire elements of different types, in particular of different diameters and different shapes, to be used. Furthermore, the method of the present invention is less sensitive to variations of thickness of the wire element and to variations of dimensioning of a groove at the level of a free area.

Figure 4:
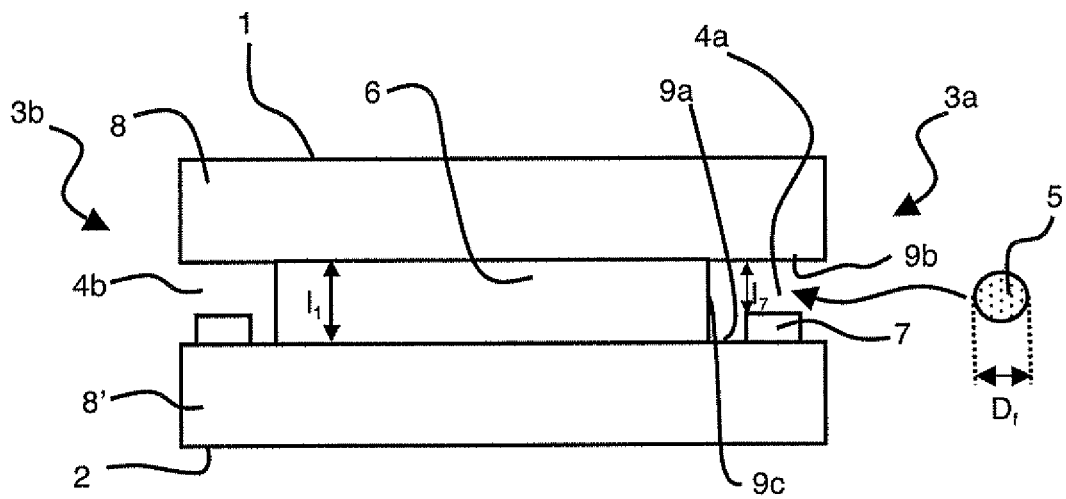
FIGS. 4 to 6 illustrate different embodiments of chips according to the invention.

According to an alternative embodiment illustrated in FIG. 4, the chip comprises two grooves 4a, 4b housing a wire element. These grooves 4a, 4b are preferably arranged on each side of link element 6 and each can comprise at least one connection pad 7. Second groove 4b is then formed, preferably at the level of a second side face 3b preferably opposite and parallel to first side face 3a. In the same way as groove 4a of first side face 3a, groove 4b of second side face 3b is at least delineated by first and second elements 8, 8' and link element 6.

The distance $I_7$ separating the apex of a pad 7 and side wall 9b opposite to said pad 7 before clamping is preferably slightly larger than diameter $D_f$ of wire element 5 to facilitate insertion thereof. After clamping, first and second elements 8, 8' are preferably fixed to one another by said deformable material which originally formed link element 6. Wire element 5 is preferably fixed after clamping to at least one of first or second elements 8, 8' of the chip by said material.

Figure 5:
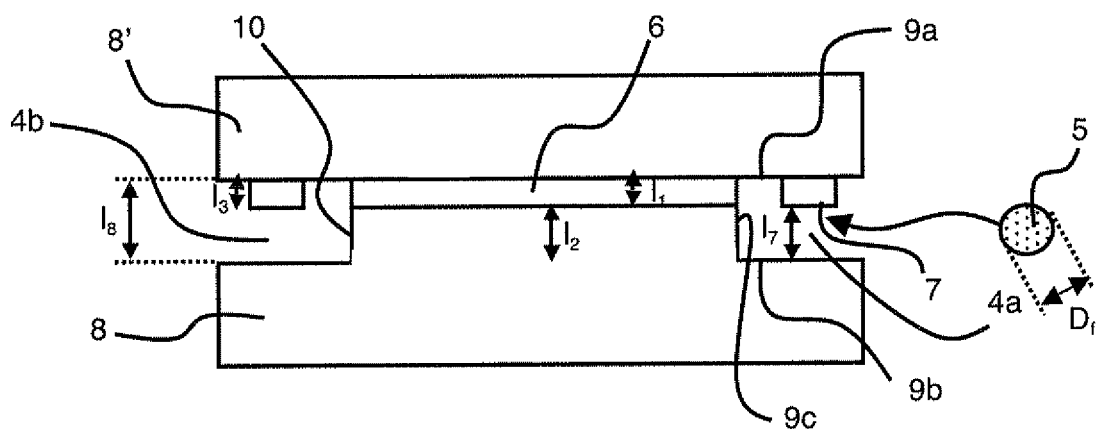

According to a second embodiment of a chip illustrated in FIG. 5, one of first or second elements 8, 8' (first element 8 in FIG. 5) comprises a salient part 10 forming a shoulder at the level of at least one edge of the element considered, in FIG. 5 two shoulders are made to partially form two similar opposite grooves 4a, 4b. The layer of deformable material forming link element 6 preferably has equivalent longitudinal and transverse dimensions to those of salient part 10 of first element 8 so as to cover the whole of the apex of salient part 10. The element not bearing salient part 10 (second element 8' in FIG. 5) is fixed to first element 8 bearing salient part 10 by means of link element 6. Groove 4a is thereby preferably delineated by two opposite side walls 9a, 9b respectively formed by the free surfaces facing first and second elements 8, 8' and by a bottom 9c joining the two side walls 9a, 9b, said bottom 9c being formed by salient part 10 and link element 6. The distance $I_8$ separating the two side walls 9a, 9b of the groove is equal to the height $I_1$ of link element 6 plus the height $I_2$ of salient part 10. In FIG. 5, connection pads 7 of grooves 4a and 4b are supported by second element 8' which is then an active element comprising for example electronic components.

After clamping, to enable sufficient pinching of a wire element 5 in an associated groove at the level of the free area between the apex of pad 7 and side wall 9b opposite said pad 7, it is preferable for height $I_2$ of salient part 10 plus a residual thickness of the deformable material layer to be greater than height $I_3$ of the pad so that at least a part of the wire element can be secured. It is further preferable for the difference between height $I_2$ of salient part 10 plus the residual thickness of the deformable material layer after clamping on the one hand, and height $I_3$ of the connection pad on the other hand to be less than diameter $D_f$ of wire element 5. This constraint enables pinching, after clamping, of an electrically conductive wire element between electrical connection pad 7 and side wall 9b of the groove opposite the apex of said connection pad 7, at the level of the free area. Preferably, as described in the foregoing, distance $I_7$ separating the apex of pad 7 and side wall 9b opposite said pad 7 before clamping is slightly larger than the diameter of wire element 5 to facilitate insertion thereof. Naturally, after clamping, first and second elements 8, 8' are preferably fixed to one another by said material which originally formed link element 6. More precisely, the deformable layer of the link element is thinned between the two elements 8, 8' and the residual thickness of deformable material enables fixing of said elements 8, 8' to be ensured. The rest of the deformable layer has preferably flowed up to conducting pads 7 and to the wire elements present in grooves 4a, 4b. Wire element 5 is thereby preferably fixed to at least one of first or second elements 8, 8' of the chip by said deformable material. If wire element 5 presents an enamelling or is covered by an insulating layer of polymer, then the previously defined height difference is preferably smaller than the diameter of the electrically conducting core of wire element 5.

Figure 6:
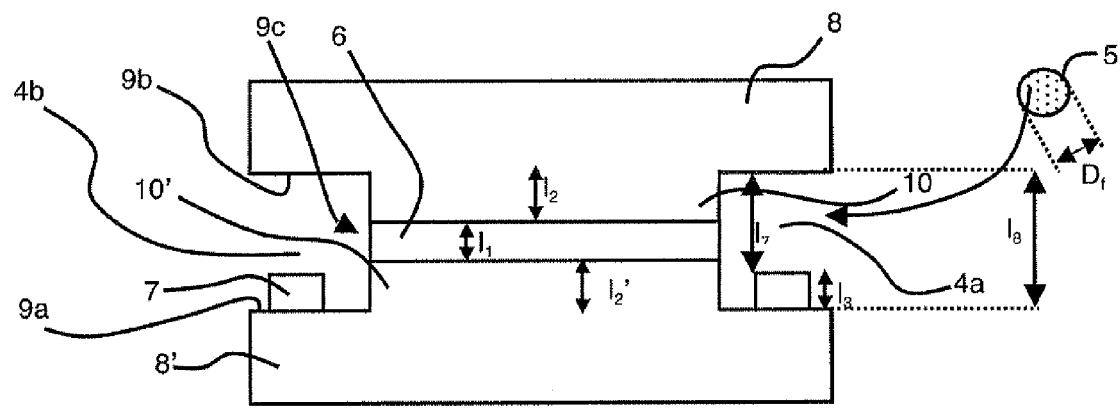

According to a third embodiment of an electronic chip illustrated in FIG. 6, the two elements 8 and 8' respectively present a salient part 10 and 10' forming shoulders at the level of the edges of elements 8, 8'. The lateral and longitudinal dimensions of salient parts 10, 10' are preferably similar to those of link element 6. On at least one of its side faces 3a, 3b, such a chip comprises a groove 4a delineated by two opposite side walls 9a, 9b respectively formed by the facing free surfaces of first and second elements 8, 8' and by a bottom 9c joining the two side walls 9a, 9b, said bottom being formed by salient part 10 of first element 8, salient part 10' of second element 8' and link element 6. In other words, the distance $I_5$ separating the two side walls 9a, 9b of groove 4a is equal to the height $I_1$ of link element 6, plus the height $I_2$ of salient part 10 of first element 8 and plus the height $I'_2$ of salient part 10' of second element 8' ($I_8=I_1+I_2+I'_2$). In the example of FIG. 6, the chip comprises two opposite grooves 4a and 4b, and electrical connection pads 7 are supported by second element 8' which comprises for example electronic components connected to connection pads 7.

To achieve sufficient pinching of wire element 5 at the level of the free area between the apex of a pad 7 and the side wall opposite said pad (wall 9b in FIG. 7) after clamping, it is preferable for the height $I_2$ of salient part 10 of first element 8, plus the height $I'_2$ of salient part 10' of second element 8', to which a residual thickness of the deformable material layer is added, to be greater than the height $I_3$ of each connection pad 7 so that at least a part of the wire element can be secured after clamping. It is moreover preferable for the difference between the height $I_2$ of salient part 10 of first element 8, plus the height $I'_2$ of salient part 10' of second element 8' added to the residual thickness of the deformable material layer after clamping on the one hand, and the height $I_3$ of the connection pad on the other hand, to be smaller than the diameter $D_f$ of wire element 5. This constraint enables an electrically conductive wire element to be pinched between electrical connection pad 7 and side wall 9b of the groove opposite the apex of said connection pad 7 at the level of the free area, after clamping. The distance $I_7$ separating the apex of pad 7 and side wall 9b opposite said pad 7 before clamping is preferably slightly greater than the diameter Df of wire element 5 to facilitate insertion.

Naturally, as previously indicated, after clamping, first and second elements 8, 8' are preferably secured to one another by said material which originally formed link element 6. In like manner, wire element 5 is the preferably secured to at least one of first or second elements 8, 8' of the chip by said deformable material. If wire element 5 presents an enamelling or is covered by an insulating polymer layer, then the previously defined height difference is preferably smaller than the diameter of the electrically conducting core of wire element 5.

Figure 7:
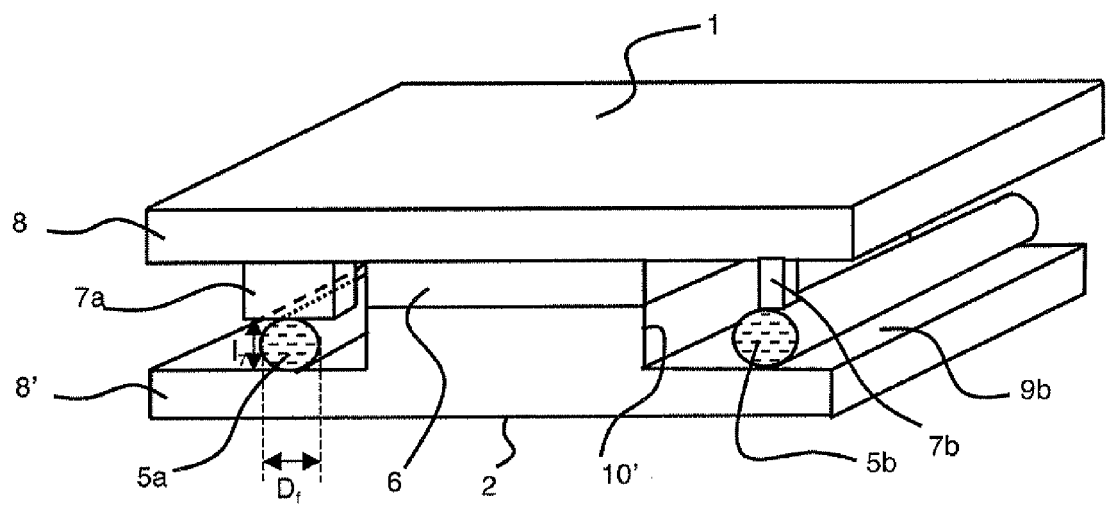
FIGS. 7 and 8 illustrate a method for assembling a wire element with an electronic chip.
Figure 8:
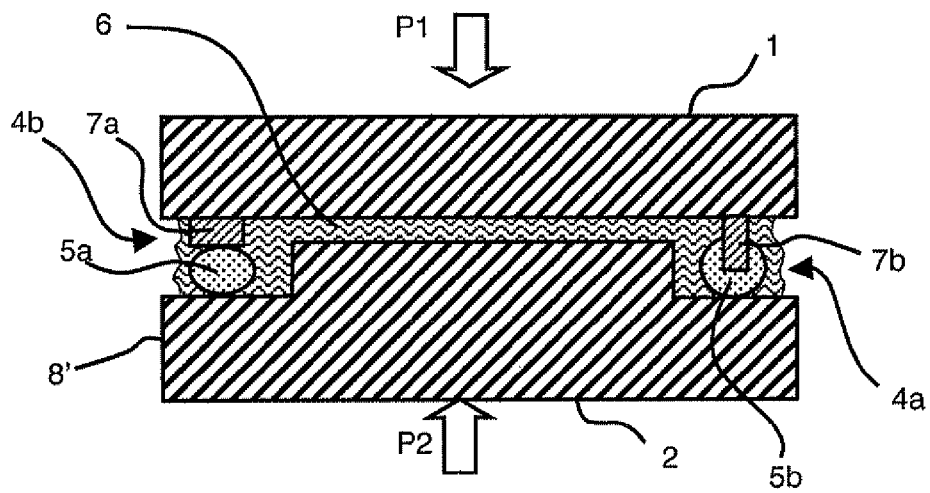

FIGS. 7 and 8 illustrate a method for assembling a chip comprising two grooves 4a, 4b as described in FIG. 5 on two wire elements. These figures illustrate the deformation of the layer of deformable material forming link element 6 when clamping is performed, for example by applying a compression force on two opposite main surfaces 1 and 2 of the chip in the direction of arrow P1 and P2. First of all, wire elements 5a, 5b are inserted longitudinally respectively in grooves 4a, 4b, preferably at the level of their free area (area separating the apex of pad 7 from the side wall opposite the groove). Then, during the clamping step of first and second elements 8, 8', link element 6 is deformed and wire elements 5a, 5b are preferably mechanically pinched at the level of the free areas between the apex of each connection pad 7 and side wall 9b opposite said connection pad 7. During clamping, the material forming link element 6 flows so as to fill at least a part of each longitudinal groove. In FIG. 8 which represents the state of the chip after clamping, the quantity of deformable material constituting link element 6 is sufficient after flowing to completely cover wire elements 5a, 5b of each groove, thereby solidifying the assembly without an addition bonding step having to be performed. The same principle naturally applies to the different embodiments.

A pad 7, 7a, 7b and associated wire element 5, 5a, 5b are preferably of different hardnesses so that, when compression takes place, the most malleable material is deformed by the least malleable material, enabling an intimate contact to be achieved favoring formation of a good electric contact between the electrical connection pad and the associated electrically conductive wire element. In general manner, if the electrical connection pad is formed by a material of greater hardness than the wire element, the connection pad can penetrate into the wire element. It is then preferable to control the clamping applied on first and second elements 8, 8' (arrows P1, P2 in FIG. 8) so as not to fragilize the wire element too much and to prevent it from being cut. In FIGS. 7 and 8, in the case where the dimensions of pad 7a (left groove), in a section of the pad parallel to the side wall supporting the latter, are larger than the diameter of the wire element, it is preferable for connection pad 7a to have a small penetration into wire element 5a after clamping. For example, the depth of penetration of pad 7a into wire element 5a can be 1 µm for a diameter of the wire element ranging from 15 µm to 500 µm. This depth enables a sufficient intimate contact to be obtained between electrical connection pad 7a and wire element 5a to make an electrically conducting connection of good quality. The depth of penetration of pad 7a into wire element 5a preferably does not exceed 20% of the diameter of wire element 5a, enabling the latter to preserve sufficient breaking strength when the assembly is stressed.

If on the other hand, in a section of said pad parallel to the side wall supporting the latter, the pad has much smaller dimensions than the diameter of the wire element 5b such as the right-hand pad 7b in FIGS. 7 and 8, the latter can penetrate into wire element 5b in pin-point manner, for example over 40% to 100% of the diameter of wire element 5b, without any risk of breaking the latter. In non-limitative manner, in this alternative embodiment, pad 7b has dimensions smaller than 20% of the diameter of wire element 5b.

Figure 9:
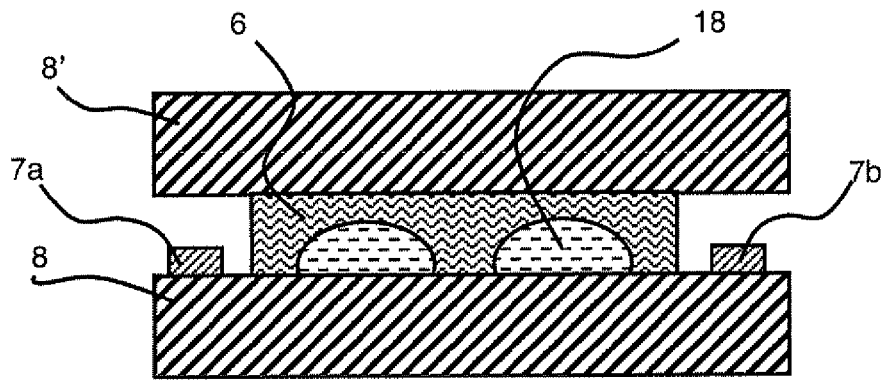
FIG. 9 illustrates a chip provided with stops in cross-sectional view.

The stresses at the level of the pinching and/or of the deformation of the link element can be controlled, as in FIG. 9, by adding stop means 18 (for example a single stop) limiting deformation of link element 6 when clamping is performed, said stop preferably being made on a surface of one of first and second elements 8, 8' (first element 8 in FIG. 9) facing the other element enabling deformation of link element 6 to be limited when clamping takes place. In FIG. 9, two stops 18 are represented by protuberances sunk in link element 6, said protuberances having greater heights than the height of pads 7a, 7b. This type of stop can naturally be added in all the other embodiments described, in particular in relation with FIGS. 2 to 6. In the embodiments comprising a salient part, this salient part can itself form the stop. During the clamping step, movement of first and second elements 8, 8' towards one another is thereby limited by the protuberances to avoid damaging wire element 5. Such protuberances also prevent flow of too large a quantity of deformable material, which could be detrimental to the quality of fixing of elements 8, 8' after clamping.

Figure 10:
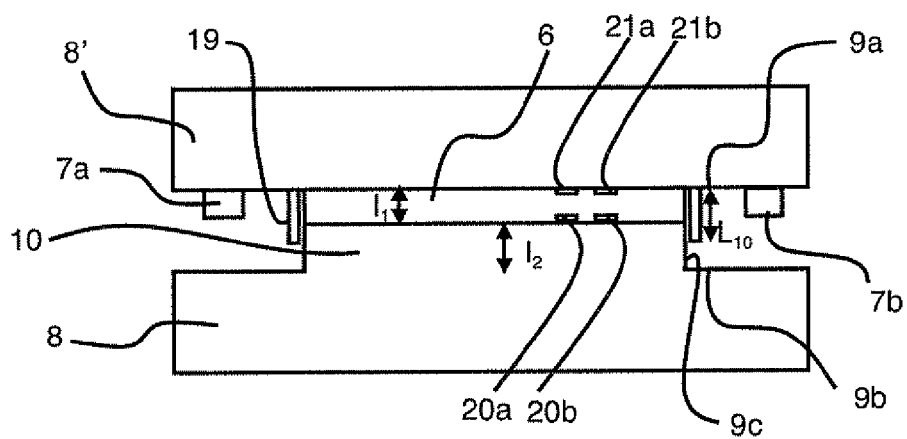
FIG. 10 illustrates a chip provided with means for guiding movement of the first and second elements towards one another in a clamping step.
Figure 11:
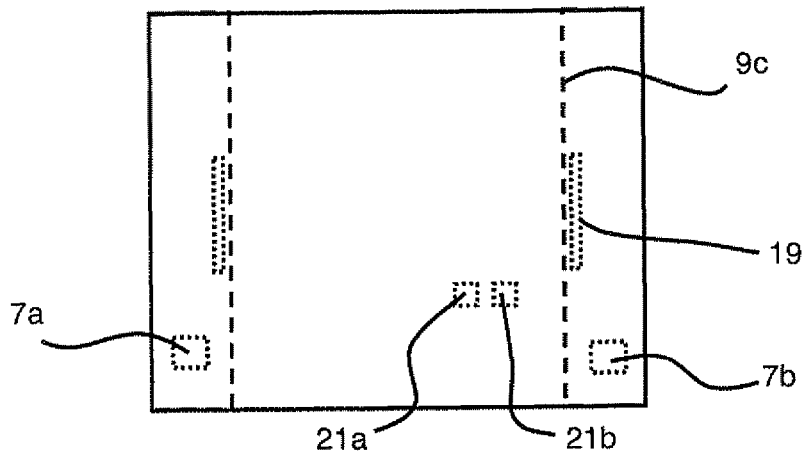
FIG. 11 illustrates a top view of the chip of FIG. 10.
Figure 12:
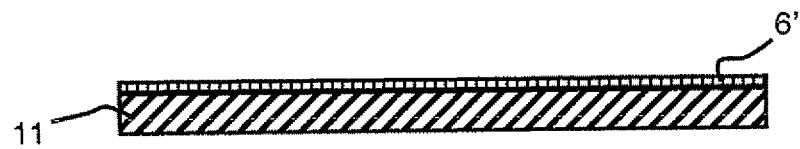
FIGS. 12, 13, 14, 17 and 18 illustrate a first method for fabricating a plurality of chips.
Figure 13:
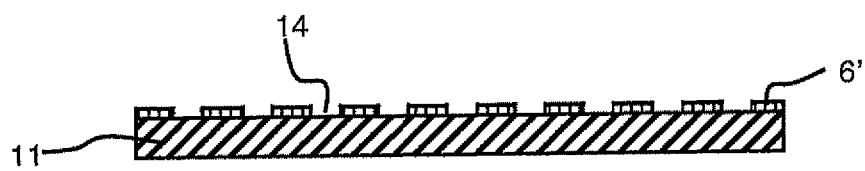

According to an alternative embodiment illustrated in FIGS. 10 and 11, first element 8 comprises a salient part 10 of substantially equal lateral and longitudinal dimensions to the lateral and longitudinal dimensions of link element 6. As in the embodiment of FIG. 5, the bottom of groove 9c is delineated by link element 6 and salient part 10. The chip further comprises guide means 19, for example salient part 10, for keeping first and second elements 8, 8' facing one another when compression takes place. Without these guide means 19, first and second elements 8, 8' can in fact move and no longer be aligned. In FIG. 10, the guide means are fixed to second element 8', preferably on each side of link element 6, and are in the form of a bar enabling salient part 10 to be guided when compression takes place. Guide means 19 preferably have a larger height $I_{10}$ than height $I_1$ of link element 6 so as to be sure that salient part 10 is correctly guided when compression takes place. Guide means 19 can further have a larger height $I_{10}$ than height $I_2$ of salient part 10 to form a stop limiting compression of link element 6.

According to an alternative embodiment, first and second elements 8, 8' are both active, i.e. they both comprise electronic components. For example purposes in FIGS. 10 and 11, first element 8 can comprise a battery (not shown) and second element 8' can comprise electronic components designed to be supplied by the battery. The battery then has to be connected to the electronics of second element 8'. For this, salient part 10 of first element 8 can comprise first electrical connection terminals 20a, 20b designed to come into electric contact with second electrical connection terminals 21a, 21b located on second element 8' when first and second elements 8, 8' are moved towards one another when clamping is performed. The presence of guide means 19 preferably enables terminals 20a and 20b to be kept respectively facing terminals 21a and 21b. A technique for producing connection terminals on two elements and connecting up of these terminals is described in the publication by J. Brun et al. "LOCALIZED MICRO-INSERT CONNECTIONS FOR SMART CARD SECURE MICRO PACKAGING" in the "4th European Microelectronics and Packaging Symposium" which was held from May $22^{nd}$ to $24^{th}$, 2006.

According to a particular embodiment, the deformable material of link element 6 is a thermosetting or thermoplastic polymer, or a fusible material.

After each wire element 5 has been inserted in the corresponding groove, thermocompression is applied to the chip (FIG. 8), i.e. a pressure force (represented by arrows P1 and P2 in FIG. 8) is applied to the two main surfaces 1 and 2 while the chip is heated by heating means (not shown). The pressure applied to main surfaces 1 and 2 depends on the deformation properties of link element 6 at a given temperature. In general manner, to soften a link element, made for example from thermoplastic or thermosetting material, the pressure can be comprised between 5 kg/cm² and 30 kg/cm² for a temperature comprised between 80° C. and 260° C., such a result being able to be obtained for example using a link element made from HT1010 marketed by Brewer Science (thermosetting polymer). When thermocompression takes place, link element 6 is softened or liquefied, and the material constituting said link element is partially expelled to the outside enabling all or a part of each groove to be filled. In FIG. 8, the link element has softened and compression of first and second elements 8 and 8' has expelled the material forming link element 6 so as to almost fill grooves 4a and 4b. Electrically conducting wire element 5 is then mechanically pinched between the apex of electrical connection pad 7 and side wall 9b of groove 4 opposite said pad. To finish, the pressure must be maintained during a cooling phase to enable the state of the assembly to be frozen. Maintaining the pressure enables the state of the electronic chip to be frozen and the intimate contact between wire element 5 and connection pad 7 to be preserved. Naturally, if the chip comprises two grooves 4a, 4b each provided with a distinct connection pad 7, the material forming the link element is preferably electrically insulating to prevent any risk of an undesired short-circuit between the pads.

In the case, among others, where the quantity of polymer (thermosetting or thermoplastic) constituting link element 6 is not sufficient to fill groove or grooves 4a, 4b, a wire element 5 covered by a polymer can be used (not shown) preferably having the same properties as the polymer forming link element 6. The polymer covering wire element 5 thus softens or becomes viscous during the thermocompression step. The sum of the material of the thermoplastic or polymer covering wire element 5 and link element 6 then enables groove or grooves 4a, 4b to be filled.

Link element 6 can also be made from fusible metallic material such as indium or lead. Lead can thus be used when the chip only comprises a single groove.

A plurality of chips as described in the foregoing can be connected to one another by means of the wire element, the electrically conducting core of the wire element then being able to constitute a common data or power supply bus of the chips.

An assembly can thus comprise a microelectronic chip comprising a first element 8 and a second element 8', and an electrically conducting wire element sandwiched between first element 8 and second element 8'. The assembly further comprises a link element 6 in contact with first and second element 8, 8' and the wire element, the link element 6 participating in fixing the wire element to at least one of first and second elements 8, 8'.

In general manner, the method for fabricating a plurality of chips can comprise the following steps:
procuring an active plate 13 comprising a plurality of active areas each including at least one electronic component, each active area being able to comprise at least one electrical connection pad 7 in the vicinity of one of its edges, in other words, an active area can include an electric contact pad 7 electrically connected to said associated active area,
forming an assembly constituted by a counterplate 11 placed on active plate 13 with interposition of a deformable material to form a cavity at the level of each active area along one of the edges of said active area, according to the alternative embodiment with pad 7, the cavity being able be formed along the edge accommodating the pad,
cutting said assembly along the edges of the active areas to form the chips, the cutting path passing through said cavities to obtain after cutting a plurality of chips each comprising at least a first and second element 8, 8' separated by a link element 6 formed by the deformable material, and a groove 4a, 4b, at the level of one surface of said chip, delineated by first and second elements 8, 8' and link element 6, said electric contact pad 7 being arranged in said groove 4a, 4b and said deformable material of link element 6 being able to flow when clamping of the chip is performed, preferably by clamping at the level of first and second elements 8, 8', up to pad 7 before first and second elements 8, 8' are brought into contact.

In fact, the active plate can be a wafer, the counterplate can also be a wafer.

Figure 14:
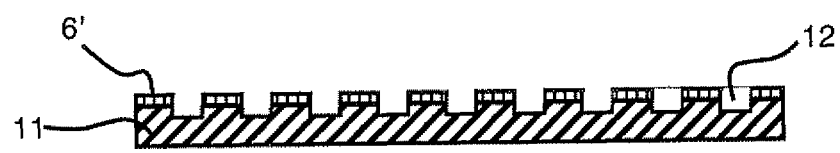

In order to optimize the yield to achieve chips of the type of those of FIG. 5, substantially parallel trenches 12 can be made on counterplate 11 before the latter is transferred to active plate 13 as in FIG. 14. Trenches 12 then form the previously defined cavities with the deformable material and the active plate.

According to a first embodiment of the method for fabricating chips illustrated in FIGS. 12 to 14 and 17 to 18, a layer of a material 6' designed to form link elements 6 is first of all deposited (FIG. 12) on counterplate 11 before the trenches are made. After deposition of material 6', the locations of link elements 6 of each chip are patterned (FIG. 13), for example by a photolithography step followed by development by annealing. For example purposes, for a polymer resin of SinR3170 type from Shinu Etsu, deposited as a 40 µm layer, development is performed by annealing at 140° C. for 30 minutes.

Trenches 12 are then made (FIG. 14) at the level of areas 14 (FIG. 13) where the polymer has been removed. Counterplate 11 is then transferred (FIG. 17) onto active plate 13 comprising the electronic components so as to align link elements 6 on each active area to delineate, the groove or grooves. After transfer and validation of the alignment, active plate 13 and counterplate 11 are pressed against one another, for example with a pressure of 5 bars at 200° C. for five minutes. Finally the chips are cut (FIGS. 18) at the level of the cavities present underneath trenches 12 of counterplate 11.

Figure 15:
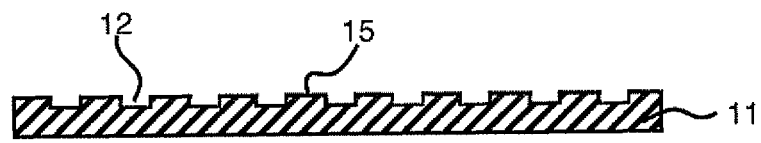
Figure 16:
Figure 17:
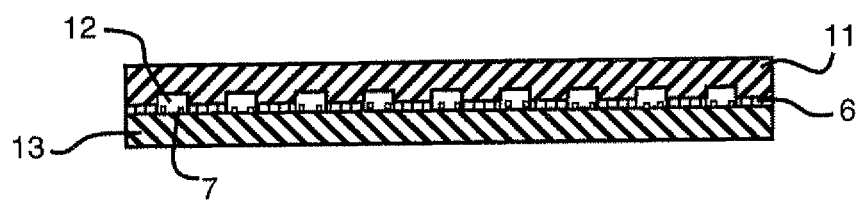
Figure 18:
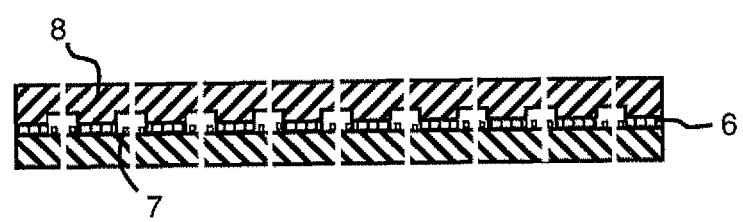

According to a second embodiment of the fabrication method illustrated in FIGS. 14 to 18, trenches 12 are first of all made in counterplate 11 (FIG. 15). Counterplate 11 is then for example dipped via the surface comprising trenches 12 in a thermosetting or thermoplastic polymer in liquid state so as to impregnate counterplate 11, for example at the apexes of portions 15 separating each trench 12 (FIG. 16) so as to form material 6'. The polymer is then dried before counterplate 11 is transferred onto active plate 13 so as to align link elements 6 on each active area to delineate the groove or grooves of each chip (FIG. 17). After transfer and validation of the alignment, active plate 13 and counterplate 11 are pressed against one another, for example with a pressure of 5 bars at 200° C. for five minutes. To finish, the chips are cut (FIG. 18) to obtain the plurality of chips.

Figure 19:
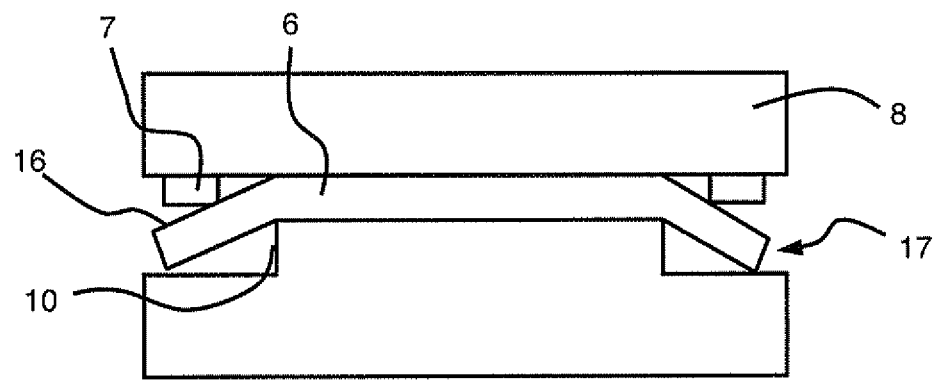
FIGS. 19 and 20 illustrate two additional alternative embodiments of chips obtained by a third and fourth method for fabricating.

According to a third embodiment of the fabrication method illustrated in FIG. 19, the material forming link elements 6 is a thermoplastic film 17 arranged between counterplate 11 and active plate 13 after formation of trenches 12 in counterplate 11. In other words, counterplate 11 is transferred onto active plate 13 so as to sandwich thermoplastic film 17. The thermoplastic film is preferably tensed to form a coherent active plate 13/thermoplastic film 17/counterplate 11 assembly preventing the thermoplastic film from presenting folds. In this alternative embodiment, when the chips are cut, a part 16 of film 17 remains free of movement in each groove as illustrated by FIG. 19. Part 16 of film 17 can be mechanically expelled to the bottom of groove 4 when wire element 5 is inserted and can melt during the thermocompression step. The excess polymer corresponding to part 16 of film 17 can thus contribute to ensuring homogeneous filling of groove 4 during the thermocompression step.

Figure 20:
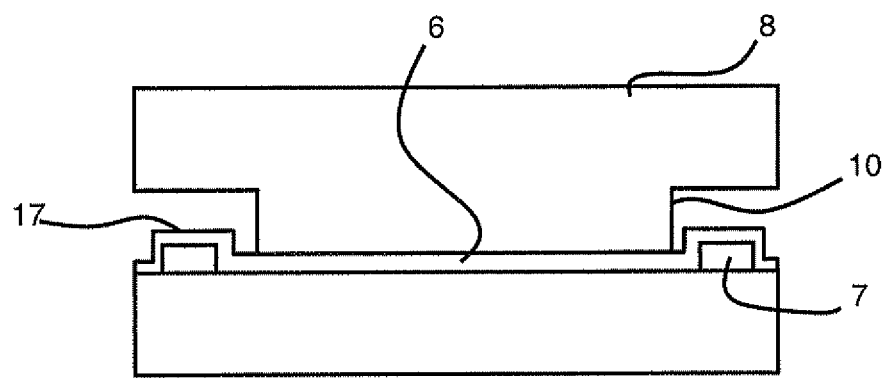

According to a variant of the third embodiment of the method, thermoplastic film 17 can be deposited on the active plate by centrifugation (FIG. 20). Thermoplastic film 17 then covers each connection pad 7, this covering being able to be mechanically removed when the wire elements are inserted or during the thermocompression step.

The electronic chips as described and their assembly method enable the design constraints of the chips to be limited, the latter no longer compulsorily having to be associated with a wire element of predetermined size corresponding to the size of the groove. The contact between the connection pads and the wire elements is thereby greatly improved.

Furthermore, each groove can comprise a plurality of pads at least one of which is electrically conductive. Non-conductive pads or pads not connected to an electronic component can be provided in each groove. Such pads then enable securing of the wire element in the groove to be enhanced.

The chips as described can be integrated in clothing to form intelligent fabrics on account of their small size.

For example purposes, the thickness of first and second elements 8, 8' can be about 200 μm and the lateral dimensions of the chips can be smaller than 5 mm.

In the case where one or more electrical connections are required to be made between the chip and the wire element, one or more electrical connection pads can be provided as described in Patent application FR0805832 and Patent application PCT/FR2008/001476. In addition to their electrical function, such pads can enable the wire element to be better secured in the groove, as described in the foregoing. Their presence is not however indispensable if the chip electronic does not have the vocation of being electrically connected by means of the wire element. Even without pads in the groove, and as indicated in the foregoing, the method of the present invention advantageously ensures good securing of the wire element in the groove by mechanical pinching. Furthermore, as indicated in the foregoing, it can be provided to make the link element flow up to the wire element so that it participates in securing the wire element in the groove.

The invention claimed is:

1. An electronic chip comprising: a first element having a first level;

and a second element, a link element disposed on the first element so as to form covered areas and uncovered areas of the first element; wherein the covered areas formed by the link element do not contain any electric contact pads; a second element having a second level and being configured to cover the link element; and an electric contact pad arranged on the first element in one of the uncovered areas of the first element, wherein the link element is formed of a material that is plastically deformable by clamping at the first and second levels of the first and second elements and is able to flow up to the pad, if clamping is performed.

2. The electronic chip according to claim 1, further comprising: a stop limiting deformation of the link element when clamping is performed.

3. The electronic chip according to claim 2, wherein the stop limiting deformation of the link element is arranged on a surface of the first element facing the second element.

4. The electronic chip according to claim 1, wherein clamping is performed at the second level of the second element and a salient part of the first element.

5. The electronic chip according to claim 4, wherein the second element includes guide means of said salient part.

6. The electronic chip according to claim 5, wherein the stop is formed by the salient part or by the guide means.

7. The electronic chip according to claim 1, wherein the link element is made from thermoplastic or thermosetting polymer material or from fusible material.

8. The electronic chip according to claim 2, wherein the stop is formed by the salient part or by the guide means.

9. The electronic chip according to claim 2, wherein the stop limiting deformation of the link element is arranged within the link element.

\* \* \* \* \*